(12) United States Patent
Livings et al.

(10) Patent No.: US 10,584,411 B2
(45) Date of Patent: Mar. 10, 2020

(54) CHROMIUM-ENRICHED DIFFUSED ALUMINIDE

(71) Applicant: United Technologies Corporation, Hartford, CT (US)

(72) Inventors: Mark A. Livings, East Windsor, CT (US); Chelsea Brown, Middletown, NY (US)

(73) Assignee: United Technologies Corporation, Farmington, CT (US)

( * ) Notice: Subject to any disclaimer, the term of this patent is extended or adjusted under 35 U.S.C. 154(b) by 1012 days.

(21) Appl. No.: 14/792,721

(22) Filed: Jul. 7, 2015

(65) Prior Publication Data

US 2016/0017481 A1 Jan. 21, 2016

Related U.S. Application Data

(60) Provisional application No. 62/026,143, filed on Jul. 18, 2014.

(51) Int. Cl.
*C23C 16/06* (2006.01)
*C23C 16/46* (2006.01)
(Continued)

(52) U.S. Cl.
CPC ............. *C23C 16/06* (2013.01); *B32B 15/01* (2013.01); *C23C 10/02* (2013.01); *C23C 10/06* (2013.01);
(Continued)

(58) Field of Classification Search
CPC ......... C23C 16/06; C23C 16/46; C23C 10/02; C23C 10/14; C23C 10/16; C23C 10/28; C23C 16/10; C23C 16/12; C23C 16/56; C23C 10/06; C23C 10/08; C23C 10/10; C23C 16/00; C23C 16/0272; C23C 16/0281; C23C 16/08; C23C 28/00; C23C 28/02; C23C 28/021; C23C 28/023; C23C 10/18; C23C 10/20; C23C 10/24; C23C 10/30; C23C 10/32; C23C 10/34; C23C 10/36; C23C 10/38; C23C 10/48;
(Continued)

(56) References Cited

U.S. PATENT DOCUMENTS 2,847,371 A  8/1958  Topelian
3,801,353 A  4/1974  Brill-Edwards
(Continued)

FOREIGN PATENT DOCUMENTS

EP  2631325  8/2013
EP  2743369  6/2014
GB  2439313  12/2007

OTHER PUBLICATIONS

European Search Report for European Patent Application No. 15177119 completed Dec. 16, 2015.

*Primary Examiner* — Michael E. La Villa
(74) *Attorney, Agent, or Firm* — Carlson, Gaskey & Olds, P.C.

(57) ABSTRACT

A method of applying a protective coating to an article comprises the steps of a) depositing aluminum in a surface region of an article, and b) depositing chromium is the surface region of the article subsequent to step a), whereby at least a portion of the chromium replaces at least a portion of the aluminum. Another method and an article are also disclosed.

17 Claims, 2 Drawing Sheets

(51) Int. Cl.
| | |
|---|---|
| B32B 15/01 | (2006.01) |
| F01D 5/28 | (2006.01) |
| C23C 10/06 | (2006.01) |
| F01D 5/18 | (2006.01) |
| C23C 10/02 | (2006.01) |
| C23C 10/14 | (2006.01) |
| C23C 10/16 | (2006.01) |
| C23C 10/28 | (2006.01) |
| C23C 16/10 | (2006.01) |
| C23C 16/12 | (2006.01) |
| C23C 16/56 | (2006.01) |
| C23C 10/32 | (2006.01) |
| C23C 10/34 | (2006.01) |
| C23C 28/00 | (2006.01) |
| C23C 28/02 | (2006.01) |
| C23C 10/24 | (2006.01) |
| C23C 10/10 | (2006.01) |
| C23C 10/30 | (2006.01) |
| C23C 10/36 | (2006.01) |
| C23C 10/08 | (2006.01) |
| C23C 16/02 | (2006.01) |
| C23C 10/18 | (2006.01) |
| C23C 10/38 | (2006.01) |
| C23C 16/08 | (2006.01) |
| C23C 16/00 | (2006.01) |
| C23C 10/20 | (2006.01) |
| C23C 10/60 | (2006.01) |
| C23C 10/52 | (2006.01) |
| C23C 10/56 | (2006.01) |
| C23C 10/54 | (2006.01) |
| C23C 10/48 | (2006.01) |

(52) U.S. Cl.
CPC .............. *C23C 10/08* (2013.01); *C23C 10/10* (2013.01); *C23C 10/14* (2013.01); *C23C 10/16* (2013.01); *C23C 10/18* (2013.01); *C23C 10/20* (2013.01); *C23C 10/24* (2013.01); *C23C 10/28* (2013.01); *C23C 10/30* (2013.01); *C23C 10/32* (2013.01); *C23C 10/34* (2013.01); *C23C 10/36* (2013.01); *C23C 10/38* (2013.01); *C23C 10/48* (2013.01); *C23C 10/52* (2013.01); *C23C 10/54* (2013.01); *C23C 10/56* (2013.01); *C23C 10/60* (2013.01); *C23C 16/00* (2013.01); *C23C 16/0272* (2013.01); *C23C 16/0281* (2013.01); *C23C 16/08* (2013.01); *C23C 16/10* (2013.01); *C23C 16/12* (2013.01); *C23C 16/46* (2013.01); *C23C 16/56* (2013.01); *C23C 28/00* (2013.01); *C23C 28/02* (2013.01); *C23C 28/021* (2013.01); *C23C 28/023* (2013.01); *F01D 5/187* (2013.01); *F01D 5/28* (2013.01); *F01D 5/288* (2013.01); *F05D 2230/314* (2013.01); *F05D 2230/90* (2013.01); *F05D 2300/121* (2013.01); *F05D 2300/132* (2013.01); *F05D 2300/175* (2013.01)

(58) Field of Classification Search
CPC ......... C23C 10/52; C23C 10/54; C23C 10/56; C23C 10/60; F01D 5/28; F01D 5/187; F01D 5/288; F05D 2300/175; F05D 2230/314; F05D 2300/132; F05D 2300/121; F05D 2230/90; B32B 15/01
See application file for complete search history.

(56) References Cited

U.S. PATENT DOCUMENTS

| | | |
|---|---|---|
| 3,874,901 A | 4/1975 | Rairden, III |
| 4,084,025 A | 4/1978 | Rairden, III |
| 4,132,816 A * | 1/1979 | Benden .................. C23C 10/08 427/237 |
| 4,290,391 A | 9/1981 | Baldi |
| 4,526,814 A | 7/1985 | Shankar et al. |
| 4,716,050 A | 12/1987 | Green et al. |
| 6,332,931 B1 | 12/2001 | Das |
| 7,132,130 B1 | 11/2006 | Kloss |
| 7,824,738 B2 | 11/2010 | Smith et al. |
| 8,262,812 B2 * | 9/2012 | Helmick .................. C23C 10/26 148/268 |
| 2004/0005410 A1 | 1/2004 | Seidel |
| 2005/0265851 A1 * | 12/2005 | Madhava ................ C23C 10/04 416/241 R |

* cited by examiner

CHROMIUM-ENRICHED DIFFUSED ALUMINIDE

CROSS-REFERENCE TO RELATED APPLICATION

The present disclosure claims priority to U.S. Provisional Patent Application No. 62/026,143, filed Jul. 18, 2014.

BACKGROUND

This disclosure relates to chromium-enriched metallic coatings.

Coatings are used to enhance corrosion resistance of gas turbine engine components, or other components in severe environments. Coatings can be, for example, aluminum coatings or chromium coatings.

SUMMARY

In a featured embodiment, a method of applying a protective coating to an article comprises the steps of a) depositing aluminum in a surface region of an article, and b) depositing chromium is the surface region of the article subsequent to step a), whereby at least a portion of the chromium replaces at least a portion of the aluminum.

In another embodiment according to the previous embodiment, prior to step b) there is a first amount of aluminum in the surface region of the article, and subsequent to step b) there is a second amount of aluminum in the surface region of the article, the second amount less than the first amount.

In another embodiment according to any of the previous embodiments, at least one of the aluminum and the chromium are deposited by chemical vapor deposition.

In another embodiment according to any of the previous embodiments, the chemical vapor deposition is performed at a temperature of between approximately 1900° F. and 2100° F. (1037.78° C. and 1148.89° C.) for a time of between approximately 1 and 6 hours.

In another embodiment according to any of the previous embodiments, step b) is performed with an activator.

In another embodiment according to any of the previous embodiments, the activator is a halide activator.

In another embodiment according to any of the previous embodiments, step a) results in an aluminum layer between approximately 0.5 and 3.0 mils (0.01 to 0.08 mm) thick.

In another embodiment according to any of the previous embodiments, step b) results in a chromium layer having approximately 20-40% chromium by weight in an outer 30 to 60% of the coating thickness.

In another embodiment according to any of the previous embodiments, step b) results in a chromium layer substantially free of alpha chromium.

In another featured embodiment, a method of applying a protective coating to an article comprises the steps of a) vapor depositing aluminum in a surface region of an article formed of a low-chromium nickel-based alloy, b) vapor depositing chromium in the surface region of the article while removing at least a portion of the aluminum using an activator, and c) heating the article such that the chromium replaces at least a portion of the aluminum through action of the activator.

In another embodiment according to the previous embodiment, step c) is performed at a temperature of between approximately 1900° F. and 2100° F. (1037.78° C. and 1148.89° C.) for a time of between approximately 4 and 20 hours.

In another embodiment according to any of the previous embodiments, the activator is a halide activator.

In another embodiment according to any of the previous embodiments, the activator interacts with the aluminum such that chromium replaces the aluminum.

In another featured embodiment, an article comprises a base alloy, a corrosion-resistant coating on the base alloy, the corrosion-resistant coating containing a region of approximately 20%-40% chromium, and an aluminum diffusion zone disposed between the base alloy and the corrosion-resistant coating.

In another embodiment according to any of the previous embodiments, the region extends between a depth of approximately 5 to 60 microns (0.2 to 2.3 mils) from a surface of the coating.

In another embodiment according to any of the previous embodiments, the region is a first region, and further comprising a second region extending from the first region to the aluminum diffusion zone, the second region having a thickness of approximately 0.6 mils (15 microns) and comprising less than approximately 10% chromium by weight.

In another embodiment according to any of the previous embodiments, the aluminum diffusion zone comprises less than approximately 20% chromium by weight.

In another embodiment according to any of the previous embodiments, the article is a turbine blade.

In another embodiment according to any of the previous embodiments, the article comprises external and internal surfaces and wherein the coating is applied to at least one of the external and internal surfaces.

In another embodiment according to any of the previous embodiments, the base alloy is at least one of a nickel-based superalloy and a low-chromium superalloy.

BRIEF DESCRIPTION OF THE DRAWINGS

The various features and advantages of the present disclosure will become apparent to those skilled in the art from the following detailed description. The drawings that accompany the detailed description can be briefly described as follows.

DETAILED DESCRIPTION

Figure 1:
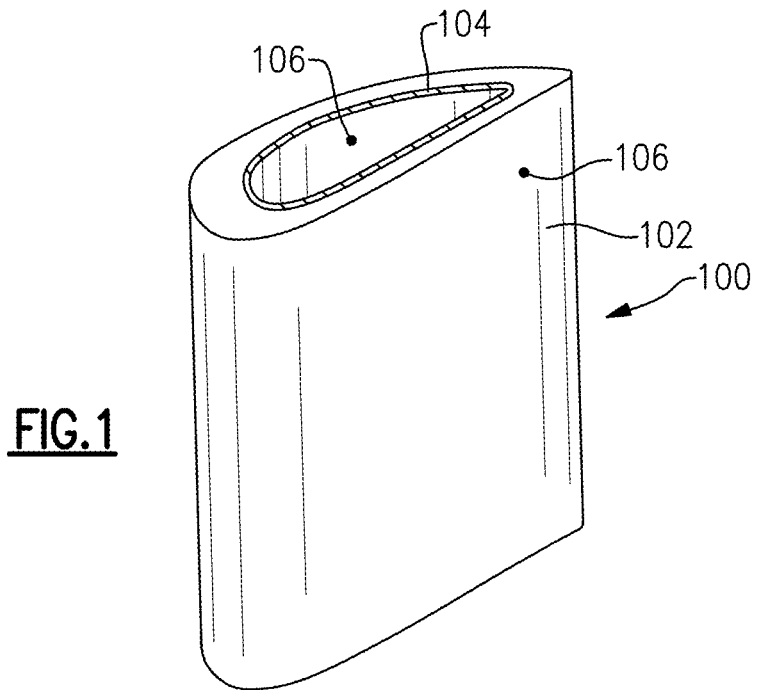
FIG. 1 illustrates an example article.

FIG. 1 schematically illustrates an example article 100. As will be described, a method 200, shown in FIG. 2, can be employed to apply a protective coating to the article 100.

In FIG. 1, the example article 100 is an airfoil having one or more external surface regions 102 and one or more internal surface 104 regions. The external surface region 102, the internal surface region 104, or both are coated with a protective coating 106. In another example, only a portion of the external and internal surface regions 102, 104 are coated with the protective coating 106. The airfoil can be an airfoil for a gas turbine engine, such as a blade or vane. However, it is also to be understood that the features descried herein are applicable to other types of articles as well.

The article 100 may be a metallic article formed of a base alloy. For example, the base alloy is a superalloy. In a further example, the superalloy is a nickel-base alloy. In a still further example, the base alloy is a low-chromium superalloy, such as a superalloy having less than approximately 12% by weight chromium.

Figure 2:
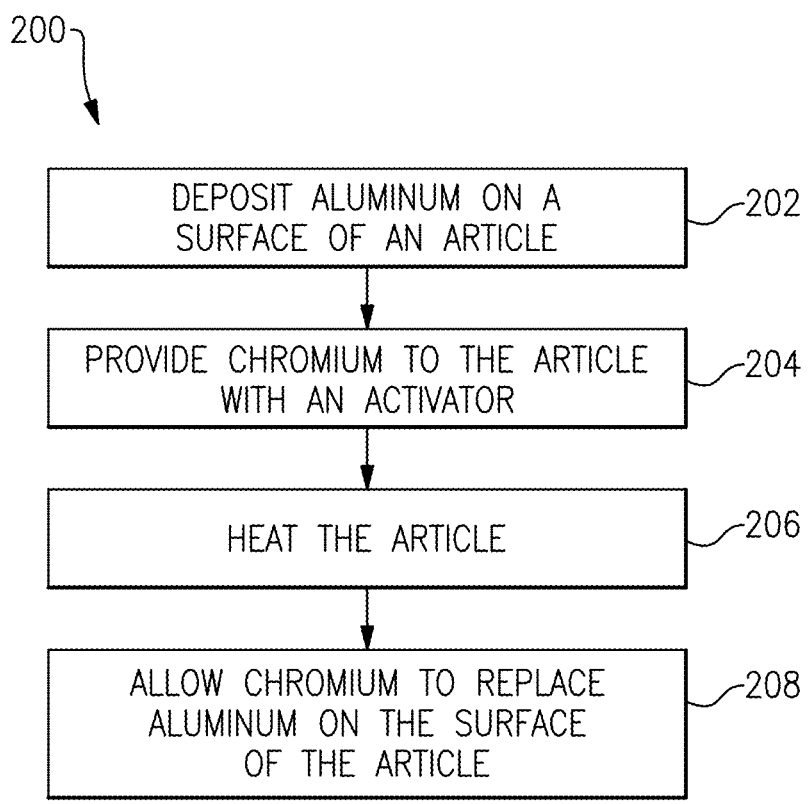
FIG. 2 illustrates an example method of applying a protective coating to an article.

The steps or actions described with respect to the method 200 to form the coating 106, shown in FIG. 2, can be employed with additional steps or other processes as desired. In Step 202, aluminum is deposited in one or more surface regions 102, 104 of the article 100 (aluminizing) The aluminizing is accomplished by chemical vapor deposition (CVD) or diffusion coating, for instance.

In a further example, the article 100 is exposed to an aluminum source material such as a chromium aluminum alloy in the presence of an activator, such as a halide activator, and a cover gas such as argon or hydrogen, at a temperature of between approximately 1900° F. and 2100° F. (1037.78° C. and 1148.89° C.) for a time of between approximately 1 and 6 hours. The halide activator can be, for instance, a fluoride or a chloride in a solid or gaseous form.

In another example process, the aluminum or aluminum source and activator can be combined with another material such as aluminum oxide powder prior to being deposited on the surfaces 102, 104 of the article 100. The other material can enhance the deposition of aluminum or the properties of the deposited aluminum. Then, the article 100 is exposed to the aluminum or aluminum mixture at a temperature of less than approximately 1500° F. (815.56° C.) for a time of between approximately 2 and 4 hours.

In another example process, the aluminum or aluminum source and activator can be combined with another material such as aluminum oxide powder prior to being deposited on the surfaces 102, 104 of the article 100. The other material can enhance the deposition of aluminum or the properties of the deposited aluminum. Then, the article 100 is exposed to the aluminum or aluminum mixture at a temperature of between 1500° F. and 1900° F. (815.56° C. and 1037.78° C.) for a time of between approximately 2 and 8 hours. In another example process, the aluminum or aluminum source and activator can be combined with another material such as aluminum oxide powder and a binder to form a slurry prior to being deposited on the surfaces 102, 104 of the article 100. The other material can enhance the deposition of aluminum or the properties of the deposited aluminum. Then, the article 100 is exposed to the aluminum or aluminum mixture at a temperature of between 1500° F. and 1900° F. (815.56° C. and 1037.78° C.) for a time of between approximately 2 and 8 hours.

Any of the processes described above can be repeated to incorporate additional aluminum multiple times. Additionally, any of the processes described above can form an aluminum coating on the surface 102, 104 of the article 100 that is between approximately 0.5 and 3.0 mils (0.01 to 0.08 mm) thick, for example.

In Steps 204-208, chromium is deposited onto article 100 (chromizing). Chromizing is accomplished by CVD or diffusion coating, similar to the processes discussed above with respect to aluminizing, in one example. The chromium is applied to the article 100 from a pure chromium source material in the form of powder nuggets with an activator such as a halide activator in Step 204. The activator may be, for example, ammonium chloride, chromium chloride, or another chloride or fluoride. Prior to step 204, the chromium can be combined with aluminum oxide, which can enhance the deposition of chromium or the properties of the deposited chromium. In Step 206, the article 100 is heated to temperature of between approximately 1900° F. and 2100° F. (1037.78° C. and 1148.89° C.) for a time of between approximately 4 and 20 hours. The heat up to temperature can coincide with the deposition, or be conducted separately. During the heating process, the activator interacts with the aluminum to allow the chromium to replace at least some of the aluminum in the coating to produce a chromium-enriched coating 106. That is, subsequent to the chromizing process of Steps 204-208, there is less aluminum in the surface regions 102, 104 of the article 100. In one embodiment, the chromium-enriched coating 106 is substantially free of alpha-chromium.

Figure 3:
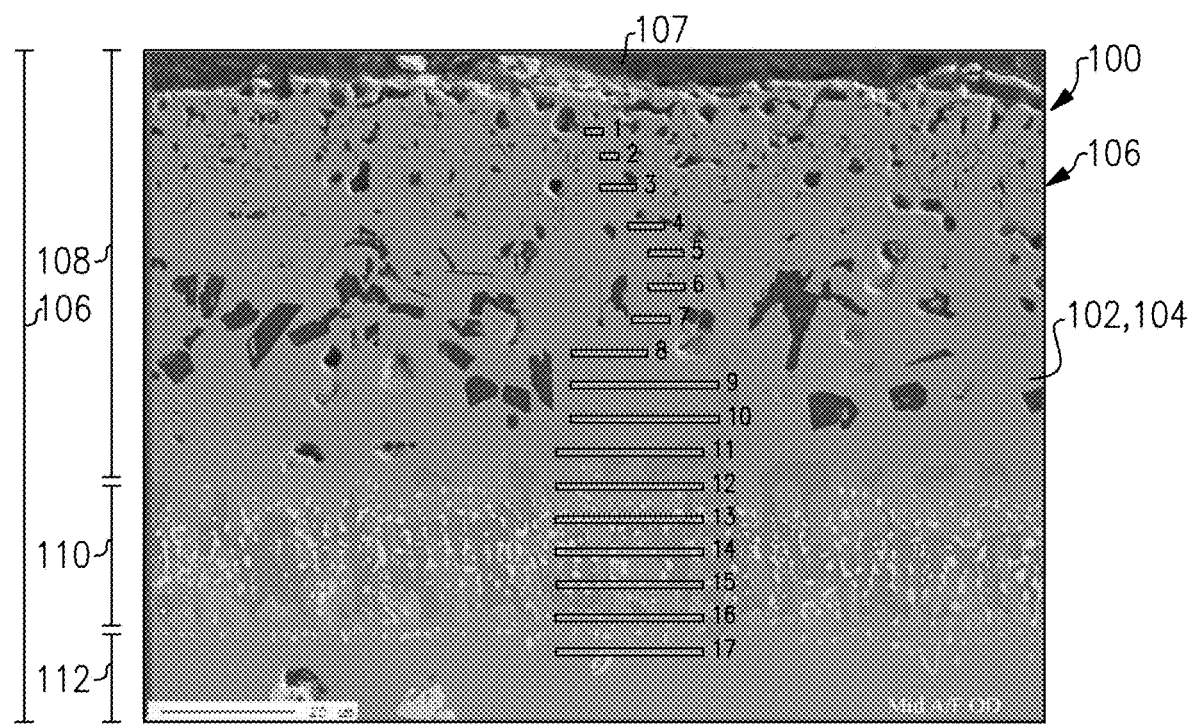
FIG. 3 illustrates a representative micrograph of a chromium-enriched coating.
Figure 4:
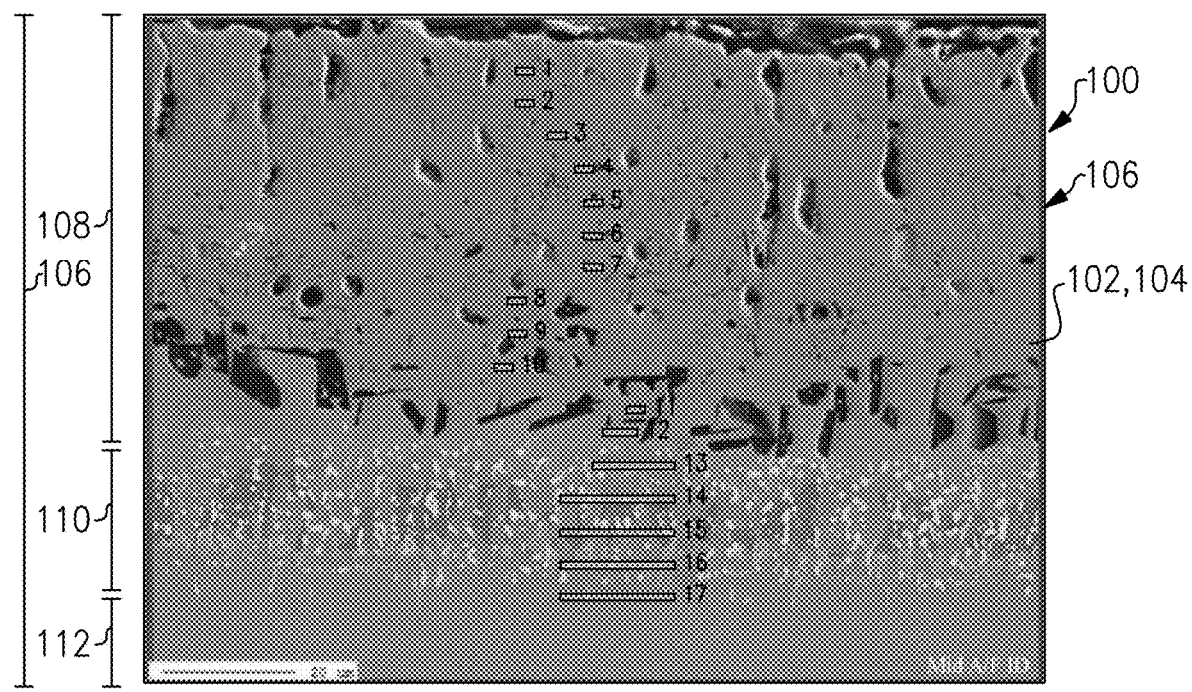
FIG. 4 illustrates another representative micrograph of a chromium-enriched coating.

FIGS. 3-4 show representative micrographs of a chromium-enriched coating 106. Areas 1-17 represent example areas of the coating 106 which were analyzed. The coating 106 includes a first region 108 at a surface 107 of the coating 106. The first region 108 extends from approximately 5 microns (0.2 mils) below the surface 107 of the coating 106 to a depth of approximately 2.3 mils (60 microns) and comprises approximately 20-40% chromium by weight. In one example, the first region 108 comprises approximately an outer 30 to 60% of the coating thickness.

The coating 106 further includes a second region 110 under the first region 108. The second region 110 is approximately 0.6 mils (15 microns) thick and comprises less than approximately 10% chromium by weight.

The coating 106 further includes an aluminum diffusion zone 112 under the second region 110 which comprises less than about 20% chromium by weight. The aluminum diffusion zone 112 is disposed between the second region 110 and the base alloy of the article 100. The aluminum diffusion zone 112 is a region of aluminum deposited during the aluminizing process of Step 202 but not replaced by chromium during the chromizing process of Steps 204-208. That is, the aluminum concentration in the portion of the aluminum diffusion zone 112 adjacent the second region 110 can have a higher aluminum concentration than the first and second regions 110, 112. The aluminum concentration in the aluminum diffusion zone 112 decreases with distance to the base alloy of the article 100.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure. The scope of legal protection given to this disclosure can only be determined by studying the following claims.

What is claimed is:

1. A method of applying a protective coating to an article, comprising the steps of:
   a) depositing aluminum in a surface region of an article; and
   b) depositing chromium in the surface region of the article with an activator subsequent to step a), whereby at least a portion of the chromium replaces at least a portion of the aluminum, wherein step b) results in a chromium layer having approximately 20-40% chromium by weight in an outer 30 to 60% of the coating thickness.

2. The method of claim 1, wherein there is less aluminum in the surface region of the article subsequent to step b) than prior to step b).

3. The method of claim 1, wherein at least one of the aluminum and the chromium are deposited by chemical vapor deposition.

4. The method of claim 3, wherein the chemical vapor deposition is performed at a temperature of between approximately 1900° F. and 2100° F. (1037.78° C. and 1148.89° C.) for a time of between approximately 1 and 6 hours.

5. The method of claim 1, wherein the activator is a halide activator.

6. The method of claim 1, wherein step a) results in an aluminum layer between approximately 0.5 and 3.0 mils (0.01 to 0.08 mm) thick.

7. The method of claim 1, wherein step b) results in a chromium layer substantially free of alpha chromium.

8. A method of applying a protective coating to an article, comprising the steps of:
   a) vapor depositing aluminum in a surface region of an article formed of a low-chromium nickel-based alloy;
   b) vapor depositing chromium in the surface region of the article while removing at least a portion of the aluminum using an activator; and
   c) heating the article such that the chromium replaces at least a portion of the aluminum through action of the activator, wherein steps b) and c) result in a chromium layer having approximately 20-40% chromium by weight in an outer 30 to 60% of the coating thickness.

9. The method of claim 8, wherein step c) is performed at a temperature of between approximately 1900° F. and 2100° F. (1037.78° C. and 1148.89° C.) for a time of between approximately 4 and 20 hours.

10. The method of claim 8, wherein the activator is a halide activator.

11. The method of claim 8, wherein the activator interacts with the aluminum such that chromium replaces the aluminum.

12. A method of applying a protective coating to an article, comprising the steps of:
   a) depositing aluminum in a surface region of an article; and
   b) depositing chromium in the surface region of the article with an activator subsequent to step a), whereby at least a portion of the chromium replaces at least a portion of the aluminum, wherein step b) results in a chromium layer substantially free of alpha chromium.

13. The method of claim 12, wherein at least one of depositing the aluminum and depositing the chromium includes forming a slurry prior to the depositing.

14. The method of claim 12, wherein there is less aluminum in the surface region of the article subsequent to step b) than prior to step b).

15. The method of claim 12, wherein at least one of the aluminum and the chromium are deposited by chemical vapor deposition.

16. The method of claim 12, wherein the activator is a halide activator.

17. The method of claim 12, wherein depositing the chromium includes forming a slurry prior to the depositing.

* * * * *